United States Patent
Akiyama

(10) Patent No.: US 8,801,125 B2
(45) Date of Patent: Aug. 12, 2014

(54) PRINTING DEVICE

(75) Inventor: Hiroaki Akiyama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 198 days.

(21) Appl. No.: 13/412,757

(22) Filed: Mar. 6, 2012

(65) Prior Publication Data

US 2012/0229535 A1    Sep. 13, 2012

(30) Foreign Application Priority Data

Mar. 9, 2011   (JP) ................................. 2011-051318

(51) Int. Cl.
  *B41J 29/38*   (2006.01)
  *B41J 2/01*    (2006.01)

(52) U.S. Cl.
  USPC .................. 347/5; 347/16; 347/101; 347/102

(58) Field of Classification Search
  USPC ........................................ 347/5, 16, 101, 102
  See application file for complete search history.

(56) References Cited

U.S. PATENT DOCUMENTS

| 5,763,892 A | 6/1998 | Kizaki et al. | |
| 2007/0024686 A1* | 2/2007 | Kadomatsu et al. | 347/102 |
| 2009/0295857 A1* | 12/2009 | Kikuchi et al. | 347/16 |

FOREIGN PATENT DOCUMENTS

| JP | 06-196554 A | 7/1994 |
| JP | 07-006512 U | 1/1995 |
| JP | 07-078751 A | 3/1995 |
| JP | 09-148290 A | 6/1997 |
| JP | 2000-108334 A | 4/2000 |
| JP | 2003-080687 A | 3/2003 |
| JP | 2003127347 A * | 5/2003 |
| JP | 3855724 B2 | 12/2006 |

\* cited by examiner

*Primary Examiner* — Jason Uhlenhake
(74) *Attorney, Agent, or Firm* — Global IP Counselors, LLP

(57) ABSTRACT

A printing device includes a discharge head, an irradiation unit and a controller. The discharge head is configured and arranged to discharge droplets of a liquid curable by active rays onto a substrate while the discharge head and the substrate move relative to each other. The irradiation unit is configured and arranged to radiate the active rays to the droplets on the substrate. The irradiation unit is provided behind the discharge head with respect to a direction of a relative movement. The controller is configured to turn off the irradiation unit when a predetermined time has elapsed since start of lighting of the irradiation unit.

5 Claims, 8 Drawing Sheets

PRINTING DEVICE

CROSS-REFERENCE TO RELATED APPLICATIONS

This application claims priority to Japanese Patent Application No. 2011-051318 filed on Mar. 9, 2011. The entire disclosure of Japanese Patent Application No. 2011-051318 is hereby incorporated herein by reference.

BACKGROUND

1. Technical Field

The present invention relates to a printing device.

2. Related Art

Techniques have recently been employed for printing predetermined information on a recording medium by applying a functional liquid on the recording medium using an inkjet method for rendering the functional liquid into droplets and discharging the droplets, and solidifying the applied functional liquid. Japanese Laid-Open Patent Publication No. 2003-80687 discloses a printing device in which an IC chip is used as the recording medium, and the printing device prints a manufacturing number, a manufacturer name, or other predetermined information on the IC chip.

Droplet discharge devices have recently been emphasized which use ultraviolet-curing ink curable by ultraviolet irradiation to record information such as described above. Ultraviolet-curing ink has preferred characteristics as a printing ink, in that ultraviolet-curing ink cures extremely slowly until irradiated by ultraviolet rays, whereupon curing proceeds rapidly. Ultraviolet-curing ink also has the advantage of low environmental impact, since the solvent thereof does not evaporate during curing.

Ultraviolet-curing ink also exhibits strong adhesion to various recording media according to the composition of the vehicle. When cured, the ink is also chemically stable and has excellent characteristics such as high adhesiveness, chemical resistance, weather resistance, and friction resistance, and is resistant to outdoor environments. Ultraviolet-curing ink can therefore be used to form images on paper, resin film, metal foil, and other thin sheet recording media, as well as on label surfaces of recording media, textile products, and the like, and on objects which have a somewhat three-dimensional surface shape.

As described in Japanese Patent No. 03855724, for example, in a case in which an inkjet printer is used in which a UV lamp or other UV irradiation means is provided beside an inkjet head, UV ink can be cured in the vicinity of the position of drawing by the inkjet head immediately after drawing. This inkjet printer has a UV irradiation range control means for controlling UV radiation from the UV irradiation means based on head position information acquired by a linear encoder, so that the range of UV radiation by the UV irradiation means coincides with the range in which ink is discharged from the head.

SUMMARY

However, the conventional techniques have such drawbacks as those described below.

In the case that driving of the UV irradiation means is controlled solely based on head position information, there is a risk of the UV irradiation means remaining lit despite a cessation of head movement due to a malfunction in the head movement means, for example. When the UV irradiation means remains lit, the recording medium can be damaged by heat, and the UV irradiation means itself may be damaged.

The present invention was developed in view of the foregoing problems, and an object of the present invention is to provide a printing device in which it is possible to circumvent problems that arise when the UV irradiation means remains lit.

In order to overcome the problems described above, a printing device according to one aspect of the present invention includes a discharge head, an irradiation unit and a controller. The discharge head is configured and arranged to discharge droplets of a liquid curable by active rays onto a substrate while the discharge head and the substrate move relative to each other. The irradiation unit is configured and arranged to radiate the active rays to the droplets on the substrate. The irradiation unit is provided behind the discharge head with respect to a direction of a relative movement. The controller is configured to turn off the irradiation unit when a predetermined time has elapsed since start of lighting of the irradiation unit.

Through the printing device of the present invention, the timing at which the irradiation unit is turned off can be controlled based on the elapsed time (a timer) since the start of lighting of the irradiation unit. Since the irradiation unit is thereby always turned off a predetermined time after the start of lighting thereof, it is possible to prevent problems such as heat damage to the substrate and malfunctioning of the irradiation unit itself when the irradiation unit remains lit.

In the printing device described above, the controller preferably specifies the predetermined time based on the speed of the relative movement and the width of the substrate in the direction of the relative movement.

Through this configuration, since the controller is preferably configured to set the predetermined time based on a speed of the relative movement and a width of the substrate in the direction of the relative movement, the irradiation unit can be turned off at least after the irradiation unit passes over the substrate.

In the printing device described above, the controller is preferably configured to set the predetermined time based on a speed of the relative movement and a width, in the direction of the relative movement, of a mounting stage for mounting the substrate.

Through this configuration, the irradiation unit can be turned off at least after having finished passing over the substrate, even when there is some error in the movement speed of the discharge head. Specifically, a margin can be maintained in the lighting time of the irradiation unit, and ultraviolet rays can be reliably radiated onto the entire area of the substrate.

The printing device described above preferably further includes a carriage integrally retaining the discharge head and the irradiation unit such that the discharge head and the irradiation unit move with respect to the substrate, and a position information acquisition device configured and arranged to acquire position information of the carriage. The controller is preferably configured to control lighting timing of the irradiation unit based on the position information of the carriage from the position information acquisition device.

Through this configuration, the controller can compute the positional relationship between the carriage and the substrate based on the position information of the carriage. The irradiation unit can thereby be lit at the optimum timing when the substrate is positioned below the irradiation unit.

The printing device described above preferably further includes a carriage integrally retaining the discharge head and the irradiation unit such that the discharge head and the irradiation unit move with respect to the substrate, and a detector configured and arranged to detect that the carriage has reached a predetermined position. The controller is preferably configured to turn on the irradiation unit in response to a detection signal from the detector.

Through this configuration, the controller can light the irradiation unit at the time at which the irradiation unit retained by the carriage, for example, moves over the substrate.

BRIEF DESCRIPTION OF THE DRAWINGS

Referring now to the attached drawings which form a part of this original disclosure.

DETAILED DESCRIPTION OF EXEMPLARY EMBODIMENTS

Figure 1A:
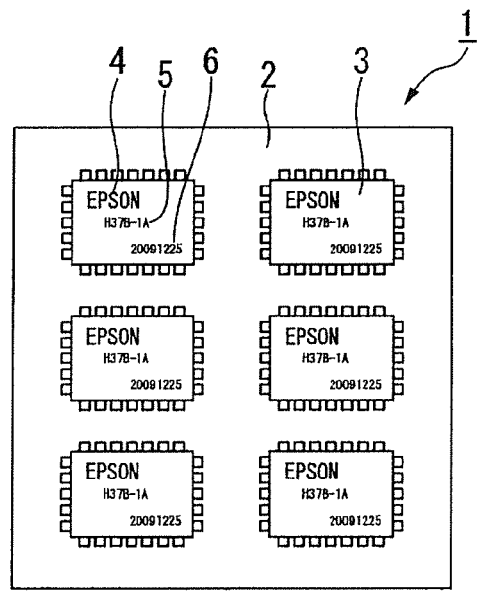
FIG. 1A is a schematic plan view showing the semiconductor board.

An embodiment of the printing device of the present invention will be described with reference to the accompanying drawings.

The embodiment described below is merely an example of the present invention and as such does not limit the present invention, and may be freely modified within the intended technical scope of the present invention. In order to facilitate understanding of components in the drawings referenced below, the scale, number of elements, and other aspects of each structure differ from the actual structure.

In the present embodiment, an example of the printing device as a characteristic feature of the present invention and an example of the printing method for printing by discharging droplets through use of the printing device will be described with reference to FIGS. 1 through 9.

Semiconductor Board

A semiconductor board as an example of the object drawn (printed) on using the printing device will first be described.

FIG. 1A is a schematic plan view showing the semiconductor board. As shown in FIG. 1A, the semiconductor board 1 as a substrate is provided with a board 2. The board 2 may be of any heat resistant material capable of packaging a semiconductor device 3, and a glass epoxy board, a paper phenolic board, a paper epoxy board, or the like may be used as the board 2.

The semiconductor device 3 is packaged on the board 2. A company name mark 4, a model code 5, a manufacturing number 6, or other marks (printed patterns, predetermined patterns) are drawn on the semiconductor device 3. These marks are drawn by a printing device.

Printing Device

Figure 1B:
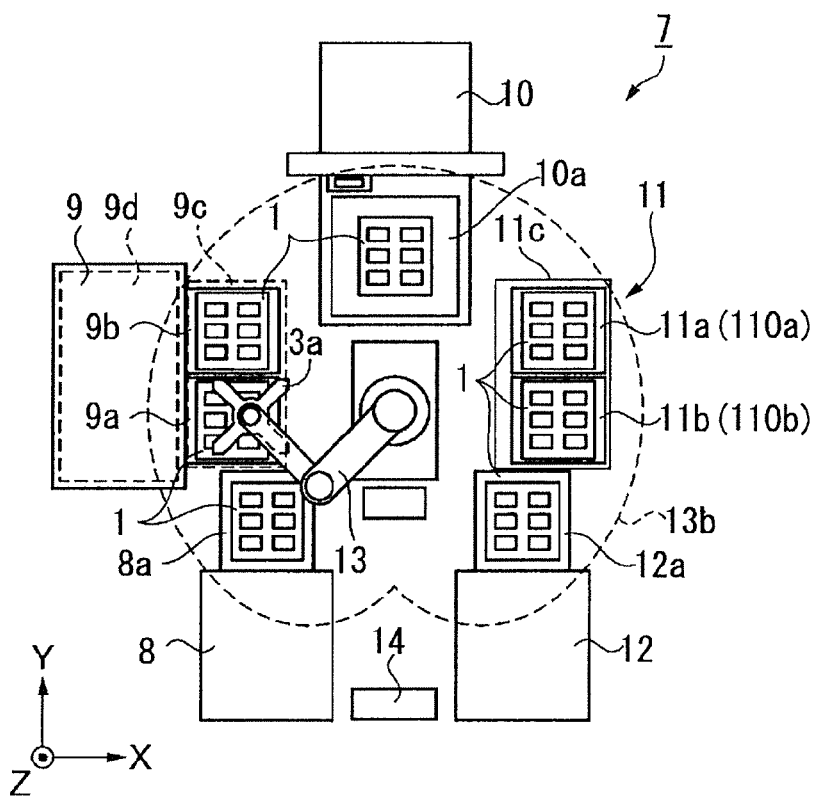
FIG. 1B is a schematic plan view showing the droplet discharge device.

FIG. 1B is a schematic plan view showing the printing device.

As shown in FIG. 1B, the printing device 7 is composed primarily of a feed unit 8, a preprocessing unit 9, an application unit (printing unit) 10, a cooling unit 11, a storage unit 12, a conveyance unit 13, and a controller 14. In the printing device 7, the feed unit 8, the preprocessing unit 9, the application unit 10, the cooling unit 11, the storage unit 12, and the controller 14 are arranged in this order clockwise around the conveyance unit 13. The feed unit 8 is disposed next to the controller 14. The direction in which the feed unit 8, the controller 14, and the storage unit 12 are arranged is the X direction. The direction orthogonal to the X direction is the Y direction, and the application unit 10, the conveyance unit 13, and the controller 14 are arranged in the Y direction. The perpendicular direction is the Z direction.

The feed unit 8 is provided with a storage container in which a plurality of semiconductor boards 1 is stored. The feed unit 8 is provided with a relay point 8a, and semiconductor boards 1 are fed from the storage container to the relay point 8a.

The preprocessing unit 9 has the function of heating and thereby modifying the surface of the semiconductor device 3. The adhesion of the printed mark and the degree of spreading of the discharged droplets on the semiconductor device 3 are adjusted by the preprocessing unit 9. The preprocessing unit 9 is provided with a first relay point 9a and a second relay point 9b, and takes in a semiconductor board 1 prior to processing thereof from the first relay point 9a or the second relay point 9b and modifies the surface thereof. The preprocessing unit 9 then moves the processed semiconductor board 1 to the first relay point 9a or the second relay point 9b and queues the semiconductor board 1. The first relay point 9a and the second relay point 9b together form a relay point 9c. The point at which the semiconductor board 1 is located while preprocessing is taking place inside the preprocessing unit 9 is a processing point 9d.

The cooling unit 11 has the function of cooling the semiconductor board 1 which is heated and surface-modified by the preprocessing unit 9. The cooling unit 11 has processing points 11a, 11b at each of which a semiconductor board 1 is retained and cooled. The processing points 11a, 11b may be referred to collectively as a processing point 11c.

The application unit 10 has the functions of discharging droplets to the semiconductor device 3 to draw (print) a mark, and solidifying or curing the drawn mark. The application unit 10 is provided with a relay point 10a, and moves the semiconductor board 1 for which drawing has not yet been performed from the relay point 10a and performs drawing and curing processing. The application unit 10 then moves the semiconductor board 1 for which drawing has been performed to the relay point 10a and queues the semiconductor board 1.

The storage unit 12 is provided with a storage container which is capable of storing a plurality of semiconductor boards 1. The storage unit 12 is also provided with a relay point 12a, and receives the semiconductor board 1 into the storage container from the relay point 12a. An operator takes the storage container in which the semiconductor board 1 is stored from the printing device 7.

The conveyance unit 13 is disposed at the center of the printing device 7. A SCARA robot provided with two arms is used as the conveyance unit 13. A grasping part 13a for grasping the semiconductor board 1 is provided at the distal end of an arm. The relay points 8a, 9c, 10a, 11c, 12a are positioned within the movement range 13b of the grasping part 13a. Consequently, the grasping part 13a can move the semiconductor board 1 between the relay points 8a, 9c, 10a, 11c, 12a. The controller 14 is a device for controlling the operation of the printing device 7 as a whole, and manages the operational state of each component of the printing device 7. Instruction signals for moving the semiconductor boards 1 are outputted to the conveyance unit 13. The semiconductor boards 1 thereby pass through each part in sequence and drawing is performed.

Details of each component are described below.

Feed Unit

Figure 2A:
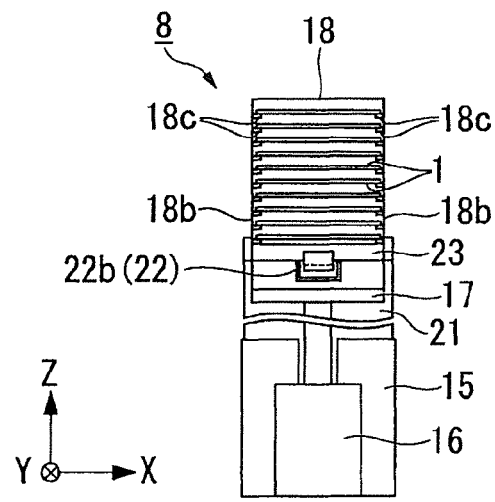
FIGS. 2A to 2C are schematic views showing the feed unit.
Figure 2B:
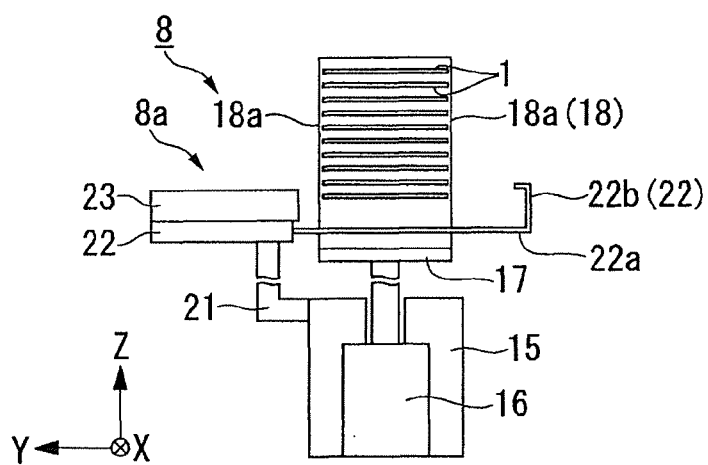
Figure 2C:
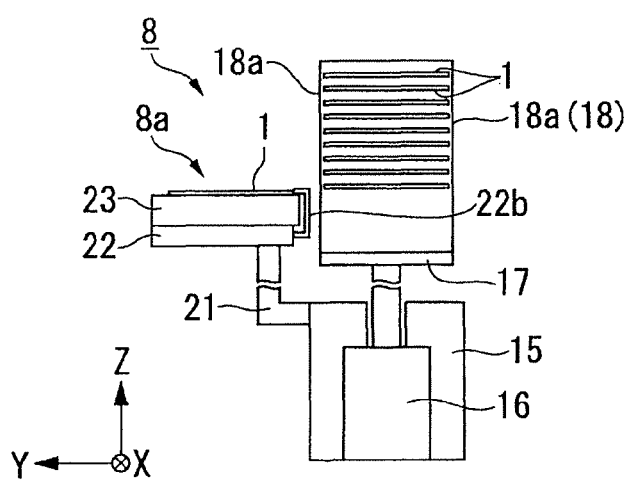

FIG. 2A is a schematic front view showing the feed unit, and FIGS. 2B and 2C are schematic side views showing the feed unit. As shown in FIGS. 2A and 2B, the feed unit 8 is provided with a base 15. An elevator device 16 is provided inside the base 15. The elevator device 16 is provided with a linear motion mechanism which operates in the Z direction. A combination of a ball screw and a rotary motor, a combination of a hydraulic cylinder and an oil pump, or another mechanism may be used as the linear movement mechanism. A mechanism composed of a ball screw and a stepping motor, for example, is used in the present embodiment. An elevator plate 17 is connected to the elevator device 16 and provided on top of the base 15. The elevator plate 17 can be raised and lowered by the elevator device 16 by predetermined movement amounts.

A storage container 18 in the shape of a rectangular solid is provided on the elevator plate 17, and a plurality of semiconductor boards 1 is stored in the storage container 18. Openings 18a are formed on both sides of the storage container 18 in the Y direction, and the semiconductor boards 1 can be taken out and put in through the openings 18a. Rails 18c protruding inward are formed on lateral surfaces 18b on both sides of the storage container 18 in the X direction, and the rails 18c are disposed so as to extend in the Y direction. A plurality of rails 18c is arranged at equal intervals in the Z direction. The semiconductor boards 1 are inserted from the Y direction or the −Y direction along the rails 18c, and the semiconductor boards 1 are thereby stored so as to be arranged in the Z direction.

A board withdrawal part 22 and a relay stage 23 are provided via a support member 21 on the Y direction side of the base 15. The relay stage 23 is disposed so as to be stacked on the board withdrawal part 22 at a location on the Y direction side of the storage container 18. The board withdrawal part 22 is provided with an arm 22a which extends and retracts in the Y direction, and a linear movement mechanism for driving the arm 22a. The linear movement mechanism is not particularly limited insofar as the linear movement mechanism moves linearly, and an air cylinder operated by compressed air, for example, is used as the linear movement mechanism in the present embodiment. A claw part 22b bent in a substantially rectangular shape is provided at one end of the arm 22a, and the distal end of the claw part 22b is formed so as to be parallel to the arm 22a.

The board withdrawal part 22 extends the arm 22a, and the arm 22a thereby penetrates into the storage container 18. The claw part 22b then moves in the −Y direction of the storage container 18. After the elevator device 16 then lowers the semiconductor board 1, the board withdrawal part 22 retracts the arm 22a. At this time, the claw part 22b moves while pressing one end of the semiconductor board 1.

As a result, the semiconductor board 1 is moved onto the relay stage 23 from the storage container 18, as shown in FIG. 2C. A recessed portion having substantially the same width as the semiconductor board 1 in the X direction is formed in the relay stage 23, and the semiconductor board 1 moves along the recessed portion. The position of the semiconductor board 1 in the X direction is determined by the recessed portion. The position of the semiconductor board 1 in the Y direction is determined by the point at which the semiconductor board 1 stops when pressed by the claw part 22b. The top of the relay stage 23 is the relay point 8a, and the semiconductor board 1 waits at a predetermined point of the relay point 8a. When the semiconductor board 1 is queued at the relay point 8a of the feed unit 8, the conveyance unit 13 moves the grasping part 13a to a point opposite the semiconductor board 1 and grasps and moves the semiconductor board 1.

After the semiconductor board 1 is moved off the relay stage 23 by the conveyance unit 13, the board withdrawal part 22 extends the arm 22a. The elevator device 16 then lowers the storage container 18, and the board withdrawal part 22 moves the semiconductor board 1 onto the relay stage 23 from within the storage container 18. The feed unit 8 thereby moves the semiconductor board 1 in sequence onto the relay stage 23 from the storage container 18. After all of the semiconductor boards 1 in the storage container 18 have been moved onto the relay stage 23, the operator replaces the empty storage container 18 with a storage container 18 in which semiconductor boards 1 are stored. The semiconductor boards 1 can thereby be fed by the feed unit 8.

Preprocessing Unit

Figure 3A:
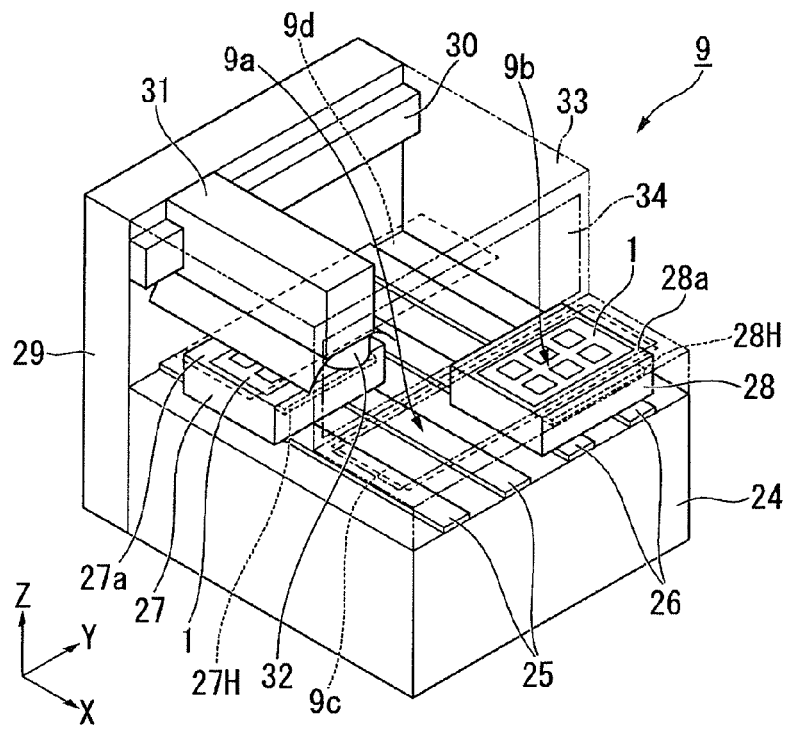
FIGS. 3A and 3B are simplified perspective views showing the configuration of the preprocessing unit.

FIG. 3 is a schematic perspective view showing the configuration of the preprocessing unit. As shown in FIG. 3A, the preprocessing unit 9 is provided with a base 24, and a first guide rail 25 and second guide rail 26 forming a pair and each extending in the X direction are provided on the base 24. A first stage 27 as a mounting stage for reciprocally moving in the X direction along the first guide rail 25 is provided on the first guide rail 25, and a second stage 28 as a mounting stage for reciprocally moving in the X direction along the second guide rail 26 is provided on the second guide rail 26. The first stage 27 and the second stage 28 are provided with a linear movement mechanism and are capable of reciprocal movement. The linear movement mechanism used herein may be the same mechanism as that of the linear movement mechanism provided to the elevator device 16, for example.

A mounting surface 27a is provided on the top surface of the first stage 27, and a suction chuck mechanism is formed in the mounting surface 27a. After the conveyance unit 13 mounts a semiconductor board 1 on the mounting surface 27a, the chuck mechanism is activated, and the preprocessing unit 9 can thereby fix the semiconductor board 1 to the mounting surface 27a. In the same manner, a mounting surface 28a is provided on the top surface of the second stage 28 as well, and a suction chuck mechanism is formed in the mounting surface 28a. After the conveyance unit 13 mounts a semiconductor board 1 on the mounting surface 28a, the chuck mechanism is activated, and the preprocessing unit 9 can thereby fix the semiconductor board 1 to the mounting surface 28a.

A heating device 27H is housed in the first stage 27, and the semiconductor board 1 mounted on the mounting surface 27a is heated to a predetermined temperature under control by the controller 14. A heating device 28H is also housed in the second stage 28, and the semiconductor board 1 mounted on the mounting surface 28*a* is heated to a predetermined temperature under control by the controller 14.

The location of the mounting surface 27*a* when the first stage 27 is positioned on the X direction side is the first relay point 9*a*, and the location of the mounting surface 28*a* when the second stage 28 is positioned in the X direction is the second relay point 9*b*. The relay point 9*c*, which includes the first relay point 9*a* and the second relay point 9*b*, is positioned within the operating range of the grasping part 13*a*, and the mounting surface 27*a* and the mounting surface 28*a* are exposed at the relay point 9*c*. Consequently, the conveyance unit 13 can easily mount a semiconductor board 1 on the mounting surface 27*a* and the mounting surface 28*a*. After the semiconductor board 1 is subjected to preprocessing, the semiconductor board 1 is queued on the mounting surface 27*a* positioned at the first relay point 9*a* or the mounting surface 28*a* positioned at the second relay point 9*b*. The grasping part 13*a* of the conveyance unit 13 can therefore easily grasp the semiconductor board 1.

A flat plate-shaped supporting part 29 is provided upright in the −X direction of the base 24. A guide rail 30 extending in the Y direction is provided at the top on the surface of the X direction side of the supporting part 29. A carriage 31 which moves along the guide rail 30 is provided in a location facing the guide rail 30. The carriage 31 is provided with a linear movement mechanism and is capable of reciprocal movement. The linear movement mechanism used herein may be the same mechanism as that of the linear movement mechanism provided to the elevator device 16, for example.

A processing unit 32 is provided on the base 24 side of the carriage 31. The processing unit 32 may be, for example, a low-pressure mercury lamp, hydrogen burner, excimer laser, plasma discharger, corona discharger, or the like for emitting active rays. In the case that a mercury lamp is used, ultraviolet rays can be radiated to the semiconductor board 1 to modify the liquid repellant properties of the surface of the semiconductor board 1. In the case that a hydrogen burner is used, an oxidized surface of the semiconductor board 1 can be partially reduced to roughen the surface. In the case that an excimer laser is used, the surface of the semiconductor board 1 can be partially melt-solidified to roughen the surface. In the case that plasma discharge or corona discharge is used, the surface of the semiconductor board 1 can be roughened by mechanical erosion. A mercury lamp, for example, is used in the present embodiment. In the preprocessing unit 9, the carriage 31 is reciprocally moved while ultraviolet rays are radiated from the processing unit 32 in a state in which the semiconductor board 1 is heated by the heating devices 27H, 28H. The preprocessing unit 9 can thereby radiate ultraviolet rays in the wide range of the processing point 9*d*.

Figure 3B:
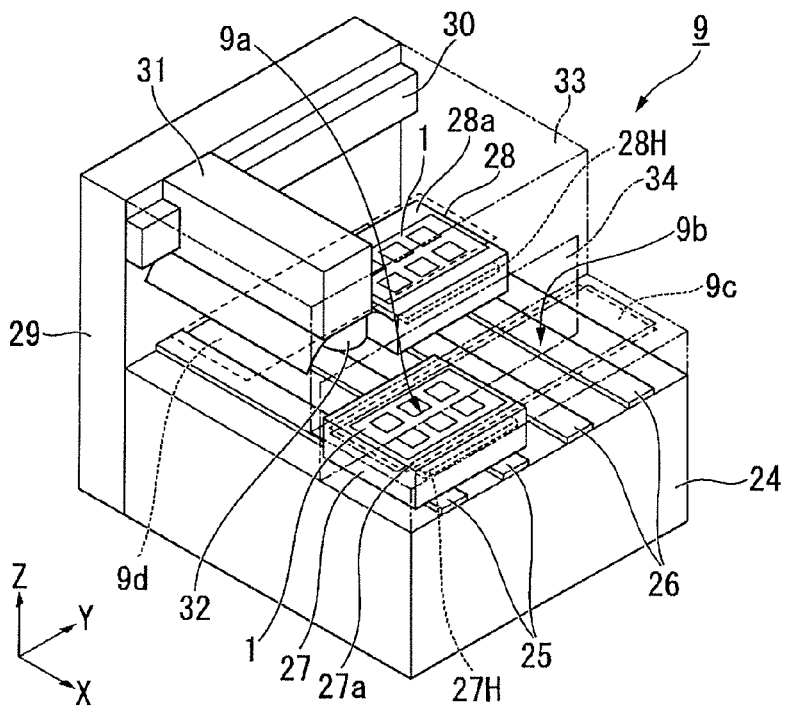

The preprocessing unit 9 is completely covered by an exterior part 33. A door part 34 capable of moving up and down is provided inside the exterior part 33. As shown in FIG. 3B, the door part 34 descends after the first stage 27 or the second stage 28 has moved to the position opposite the carriage 31. Ultraviolet rays radiated by the processing unit 32 are thereby prevented from leaking to the outside of the preprocessing unit 9.

When the mounting surface 27*a* or the mounting surface 28*a* is positioned at the relay point 9*c*, the conveyance unit 13 supplies a semiconductor board 1 to the mounting surface 27*a* or the mounting surface 28*a*. The preprocessing unit 9 then moves the first stage 27 or second stage 28 on which the semiconductor board 1 is mounted to the processing point 9*d* and performs preprocessing. After preprocessing is completed, the preprocessing unit 9 moves the first stage 27 or the second stage 28 to the relay point 9*c*. The conveyance unit 13 then removes the semiconductor board 1 from the mounting surface 27*a* or mounting surface 28*a*.

Cooling Unit

The cooling unit 11 has heat sinks or other cooling plates 110*a*, 110*b*, the top surfaces of which are suction retention surfaces for the semiconductor board 1, and which are provided at the processing points 11*a*, 11*b*, respectively.

The processing points 11*a*, 11*b* (cooling plates 110*a*, 110*b*) are positioned within the operating range of the grasping part 13*a*, and the cooling plates 110*a*, 110*b* are exposed at the processing points 11*a*, 11*b*. Consequently, the conveyance unit 13 can easily mount the semiconductor board 1 on the cooling plates 110*a*, 110*b*. After cooling of the semiconductor board 1, the semiconductor board 1 is queued on the cooling plate 110*a* at the processing point 11*a*, or on the cooling plate 110*b* at the processing point 11*b*. The grasping part 13*a* of the conveyance unit 13 can thereby easily grasp and move the semiconductor board 1.

Application Unit

The application unit 10 for discharging droplets to the semiconductor board 1 to form a mark will next be described with reference to FIGS. 4 and 5. Various types of devices may be used to discharge droplets, but a device that uses an inkjet method is preferred. An inkjet method is capable of discharging minute droplets, and is therefore suitable for micro-fabrication.

Figure 4A:
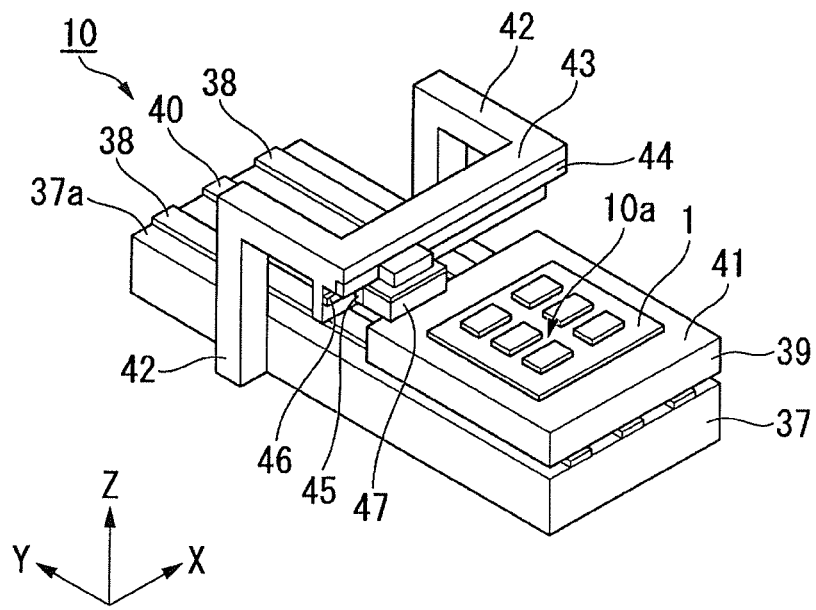
FIG. 4A is a simplified perspective view showing the configuration of the application unit.

FIG. 4A is a simplified perspective view showing the configuration of the application unit. Droplets are discharged to the semiconductor board 1 by the application unit 10. As shown in FIG. 4A, the application unit 10 is provided with a base 37 formed in a rectangular shape. The direction of relative movement of the droplet discharge head and the discharge-receiving object during discharge of droplets is referred to as the primary scanning direction. The direction orthogonal to the primary scanning direction is the secondary scanning direction. The secondary scanning direction is the direction of relative movement of the droplet discharge head and the discharge-receiving object during a line feed operation. In the present embodiment, the X direction is designated as the primary scanning direction, and the Y direction is designated as the secondary scanning direction.

On a top surface 37*a* of the base 37, a pair of guide rails 38 extending in the Y direction is provided in protruding condition along the entire width in the Y direction. A stage 39 provided with a linear movement mechanism not shown in the drawings is attached on top of the base 37 so as to correspond to the pair of guide rails 38. A linear motor, a screw-driven linear movement mechanism, or the like may be used as the linear movement mechanism of the stage 39. A linear motor, for example, is used in the present embodiment, and is configured so as to move forward and backward at a predetermined speed in the Y direction. Repeated forward and backward movement is referred to as scanning movement. A secondary scanning position detection device 40 is disposed parallel to the guide rails 38 on the top surface 37*a* of the base 37, and the position of the stage 39 is detected by the secondary scanning position detection device 40.

A mounting surface 41 is formed as the top surface of the stage 39, and a suction-type board chuck mechanism not shown in the drawings is provided to the mounting surface 41. After a semiconductor board 1 is mounted on the mounting surface 41, the semiconductor board 1 is fixed to the mounting surface 41 by the board chuck mechanism.

The mounting surface 41 is located at the relay point 10a when the stage 39 is positioned in the −Y direction. The mounting surface 41 is provided so as to be exposed within the operating range of the grasping part 13a. The conveyance unit 13 can therefore easily mount the semiconductor board 1 on the mounting surface 41. After application is performed for the semiconductor board 1, the semiconductor board 1 is queued on the mounting surface 41 at the relay point 10a. The grasping part 13a of the conveyance unit 13 can therefore easily grasp and move the semiconductor board 1.

A pair of support platforms 42 is provided upright on both sides of the base 37 in the X direction, and a guide member 43 extending in the X direction is provided so as to bridge the pair of support platforms 42. A guide rail 44 extending in the X direction is provided in protruding condition along the entire width in the X direction on the bottom side of the guide member 43. A carriage (movement means) 45 attached so as to be able to move along the guide rail 44 is formed having a substantially rectangular shape. The carriage 45 is provided with a linear movement mechanism, and a mechanism that is the same as the linear movement mechanism provided to the stage 39, for example, may be used as the linear movement mechanism of the carriage 45. The carriage 45 performs scanning movement in the X direction. A primary scanning position detection device 46 is disposed between the guide member 43 and the carriage 45, and the position of the carriage 45 is measured by the primary scanning position detection device 46. Specifically, a linear encoder is used as the primary scanning position detection device (position information acquisition device) 46 in the present embodiment. The primary scanning position detection device 46 is electrically connected to the controller 14 and configured so as to transmit measurement results to the controller 14. A head unit 47 is provided on the bottom side of the carriage 45, and a droplet discharge head not shown in the drawings is provided in protruding condition to a surface of the head unit 47 on the stage 39 side.

Figure 4B:
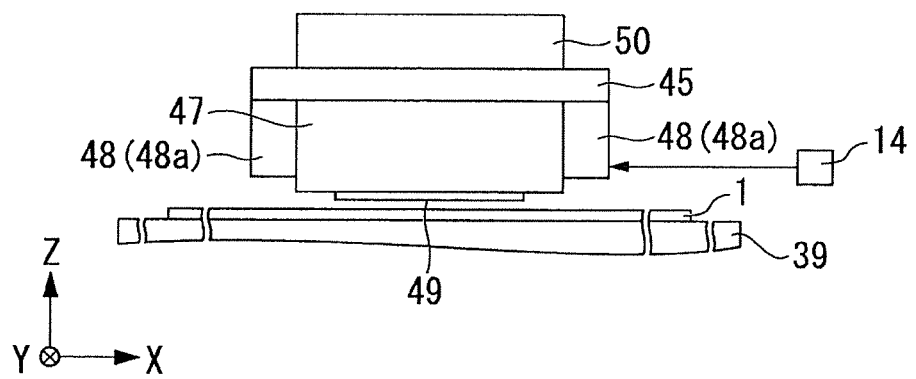
FIG. 4B is a schematic side view showing the carriage.

FIG. 4B is a schematic side view showing the carriage. As shown in FIG. 4B, curing units (irradiation units) 48 as irradiation units paired with the head unit 47 are disposed on the semiconductor board 1 side of the carriage 45. A droplet discharge head (discharge head) 49 for discharging droplets is provided in protruding condition on the semiconductor board 1 side of the head unit 47.

The curing units 48 radiate ultraviolet rays for curing the discharged droplets. The curing units 48 are disposed on both sides of the head unit 47 in the primary scanning direction (relative movement direction). The curing units 48 include light-emitting units, heat sinks, and other components. Numerous light-emitting diode (LED) elements are arranged in the light-emitting units. The type of LED element used is one which emits ultraviolet light when electrical power is received.

In the present embodiment, the controller 14 controls the timing at which the curing units 48 are lit and unlit. Specifically, the controller 14 lights the curing units 48 in the state in which the positions of the droplet discharge head 49 of the carriage 45 and the semiconductor board 1 on the mounting surface 41 of the stage 39 are aligned, based on the measurement results of the primary scanning position detection device 46.

The controller 14 also turns off the curing units 48 when a predetermined time has elapsed from the lighting of the curing units 48. The controller 14 computes the movement speed of the carriage 45 in relation to the semiconductor board 1 from a signal of the primary scanning position detection device 46, computes the time needed for the curing units 48 to pass over the entire area of the semiconductor board 1 from the movement speed and the width of the semiconductor board 1 in the movement direction (X direction) of the carriage 45, stored in advance in the controller 14, and sets the computed time as the abovementioned predetermined time.

The controller 14 thereby lights the curing units 48 at the timing at which the curing units 48 mounted to the carriage 45 are positioned over the semiconductor board 1, and at the timing at which the curing units 48 are past the semiconductor board 1, i.e., when the abovementioned predetermined time has elapsed, the controller 14 turns off the curing units 48. The curing units 48 can thereby be efficiently lit, and power consumption by the curing units 48 is minimized.

When the period for which the curing units 48 are lit is controlled based on only the position information of the carriage 45 as in the conventional technique, the controller 14 cannot discern a case in which the carriage 45 has stopped moving due to a malfunction in the linear movement mechanism of the carriage 45, for example. The curing units 48 therefore remain lit, and there is a risk of heat damage to the semiconductor board 1 and damage to the curing units 48 as a result of remaining lit for a long period of time.

In the present embodiment, however, timer control of the curing units 48 causes the curing units 48 to always turn off when a predetermined time has elapsed after the irradiation units are lit. The abovementioned problems caused by the curing units 48 remaining lit are thus prevented even when the carriage 45 stops moving, for example, as described above.

A holding tank 50 is disposed at the top of the carriage 45 as shown in the drawing, and a functional liquid is accommodated in the holding tank 50. The droplet discharge head 49 and the holding tank 50 are connected by a tube not shown in the drawings, and the functional liquid in the holding tank 50 is fed to the droplet discharge head 49 through the tube.

The functional liquid is primarily composed of a photopolymerization initiator as a curing agent, and a solvent or a dispersion medium. Functional liquids having specific functions can be formed by adding pigments, dyes, and other colorants, or functional materials such as materials for modifying surface properties such as hydrophilic or hydrophobic properties, to the primary ingredients described above. A white pigment, for example, is added in the present embodiment. A resin material in the functional liquid is a material for forming a resin film. The resin material is not particularly limited insofar as the resin material is liquid at normal temperature and is a material that forms a polymer by polymerization. The resin material preferably has low viscosity and is in the form of an oligomer. The resin material is more preferably in the form of a monomer. The photopolymerization initiator is an additive for acting on a cross-linkable group of a polymer to promote a cross-linking reaction, and benzyl dimethyl ketal, for example, or the like may be used as the photopolymerization initiator. The solvent or dispersion medium adjusts the viscosity of the resin material. Giving the functional liquid a viscosity that allows the functional liquid to easily be discharged from the droplet discharge head enables the droplet discharge head to stably discharge the functional liquid.

Figure 5A:
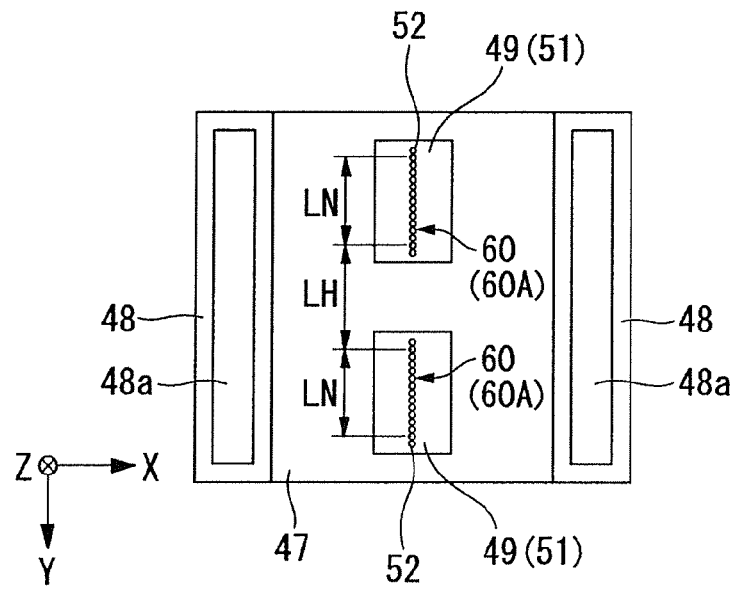
FIG. 5A is a schematic plan view showing the head unit.

FIG. 5A is a schematic plan view showing the head unit. As shown in FIG. 5A, two droplet discharge heads 49 which constitute first and second discharge heads are disposed in the head unit 47 at a distance from each other in the secondary scanning direction, and a nozzle plate 51 is provided to a surface of each of the droplet discharge heads 49. A plurality of nozzles 52 is formed and arranged in each nozzle plate 51.

In the present embodiment, a nozzle row 60 in which fifteen nozzles 52 are arranged in the secondary scanning direction is provided in each nozzle plate 51. The two nozzle rows 60 are arranged in a line in the Y direction and disposed at a position the same distance in the X direction from the curing unit 48 on each side thereof.

In the droplet discharge heads 49, since the discharge characteristics of the droplets at the nozzles 52 at both ends of each nozzle row 60 tend to be unstable, these nozzles 52 are not used in droplet discharge processing. Specifically, true nozzle rows 60A for actually discharging droplets to the semiconductor board 1 are each formed by the thirteen nozzles 52 other than the end nozzles 52 in the present embodiment.

Here, adjacent droplet discharge heads 49 are disposed in a positional relationship that satisfies the equation shown below, where LN is the length of each true nozzle row 60A in the secondary scanning direction, and LH is the distance in the secondary scanning direction between true nozzle rows 60A of adjacent droplet discharge heads 49.

$$LH = n \times LN \text{ (where } n \text{ is a positive integer)} \quad (1)$$

In the present embodiment, two droplet discharge heads 49 are disposed in the Y direction in a positional relationship such that n=1, i.e., LH=LN.

Irradiation holes 48a are formed in bottom surfaces of the curing units 48. The irradiation holes 48a are provided so as to have an irradiation range of a length equal to or greater than the sum of the lengths of the droplet discharge heads 49, 49 in the Y direction and the distance between the droplet discharge heads 49, 49. The ultraviolet light emitted by the curing units 48 is radiated to the semiconductor board 1 from the irradiation holes 48a.

Figure 5B:
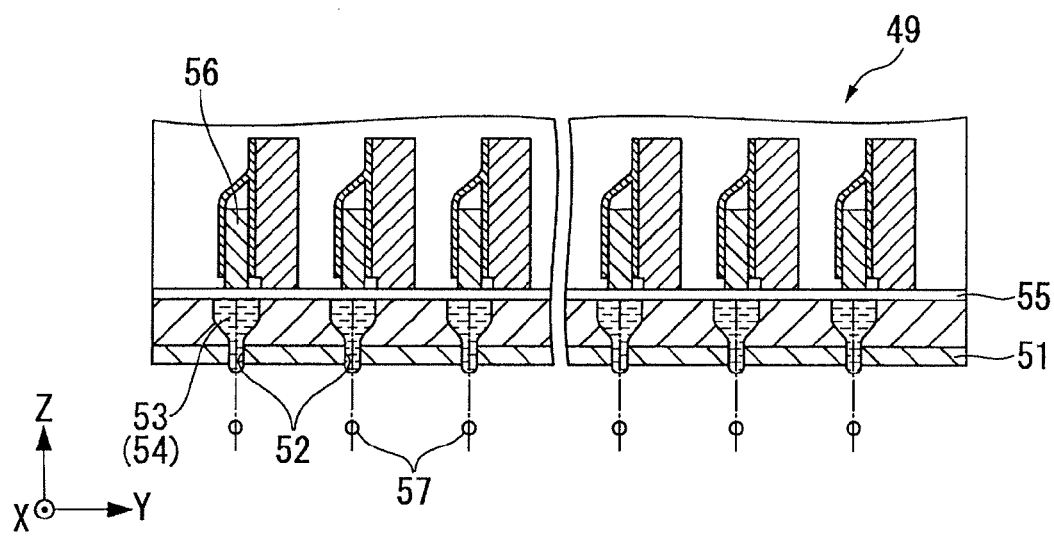
FIG. 5B is a schematic sectional view of relevant parts, showing the structure of a droplet discharge head.

FIG. 5B is a schematic sectional view of relevant parts, showing the structure of a droplet discharge head. As shown in FIG. 5B, the droplet discharge head 49 is provided with a nozzle plate 51, and the nozzles 52 are formed in the nozzle plate 51. Cavities 53 communicated with the nozzles 52 are formed on a top side of the nozzle plate 51 in positions corresponding to the nozzles 52. The functional liquid (liquid body) 54 is fed to the cavities 53 of the droplet discharge head 49.

A diaphragm 55 for vibrating in the vertical direction to expand and contract the volume inside the cavities 53 is provided on a top side of the cavities 53. Piezoelectric elements 56 for expanding and contracting in the vertical direction to vibrate the diaphragm 55 are provided in locations corresponding to each cavity 53 on the top side of the diaphragm 55. The piezoelectric elements 56 expand and contract in the vertical direction to compress and vibrate the diaphragm 55, and the diaphragm 55 expands and contracts the volume inside the cavities 53 to compress the cavities 53. The pressure inside the cavities 53 thereby fluctuates, and the functional liquid 54 fed into the cavities 53 is discharged through the nozzles 52.

When the droplet discharge head 49 receives a nozzle drive signal for controlling and driving the piezoelectric elements 56, the piezoelectric elements 56 elongate, and the diaphragm 55 contracts the volume inside the cavities 53. As a result, an amount of the functional liquid 54 commensurate with the reduction in volume is discharged as a droplet 57 from each nozzle 52 of the droplet discharge head 49. Ultraviolet light is radiated from the irradiation holes 48a to the semiconductor board 1 on which the functional liquid 54 is applied, and the functional liquid 54 including the curing agent is solidified or cured.

Storage Unit

Figure 6A:
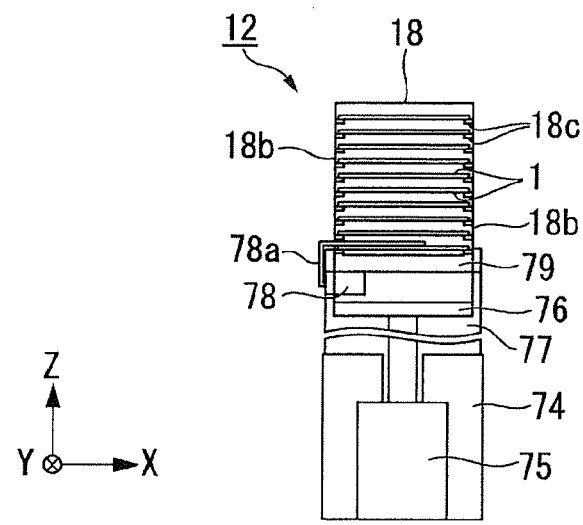
FIGS. 6A to 6C are schematic views showing the storage unit.
Figure 6B:
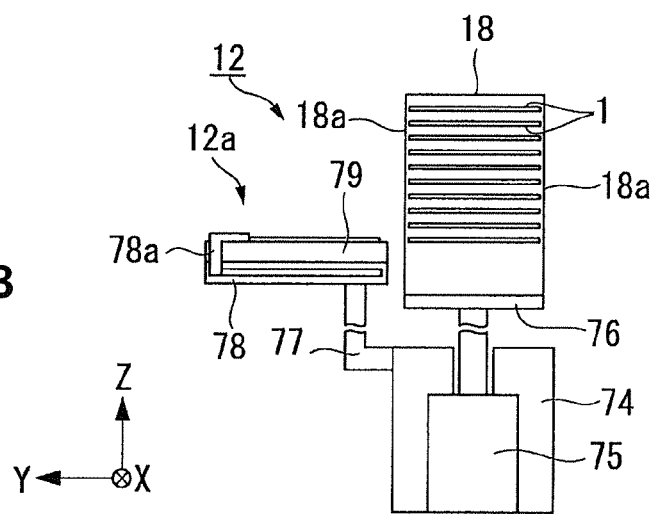
Figure 6C:
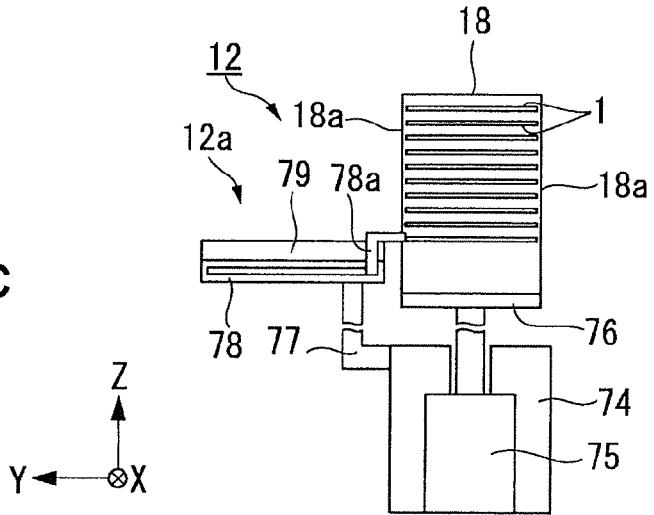

FIG. 6A is a schematic front view showing the storage unit, and FIGS. 6B and 6C are schematic side views showing the storage unit. As shown in FIGS. 6A and 6B, the storage unit 12 is provided with a base 74. An elevator device 75 is provided inside the base 74. A device the same as the elevator device 16 provided to the feed unit 8 may be used as the elevator device 75. An elevator plate 76 is connected to the elevator device 75 and provided on top of the base 74. The elevator plate 76 can be raised and lowered by the elevator device 75. A storage container 18 in the shape of a rectangular solid is provided on the elevator plate 76, and semiconductor boards 1 are stored in the storage container 18. A container the same as the storage container 18 provided to the feed unit 8 is used as the storage container 18.

A board push-out part 78 and a relay stage 79 are provided on the Y-direction side of the base 74 via a support member 77. The relay stage 79 is disposed so as to be stacked on the board push-out part 78 at a location on the Y direction side of the storage container 18. The board push-out part 78 is provided with an arm 78a which moves in the Y direction, and a linear movement mechanism for driving the arm 78a. The linear movement mechanism is not particularly limited insofar as the linear movement mechanism moves linearly, and an air cylinder operated by compressed air, for example, is used as the linear movement mechanism in the present embodiment. A semiconductor board 1 is mounted on the relay stage 79, and the arm 78a can contact the semiconductor board 1 at the center of one end of the semiconductor board 1 on the Y direction side thereof.

The board push-out part 78 moves the arm 78a in the −Y direction, and the arm 78a thereby moves the semiconductor board 1 in the −Y direction. A recessed portion having substantially the same width as the semiconductor board 1 in the X direction is formed in the relay stage 79, and the semiconductor board 1 moves along the recessed portion. The position of the semiconductor board 1 in the X direction is determined by the recessed portion. As a result, the semiconductor board 1 is moved in the storage container 18, as shown in FIG. 6C. Rails 18c are formed in the storage container 18, and the rails 18c are positioned on lines extending from the recessed portion formed in the relay stage 79. The semiconductor board 1 is moved along the rails 18c by the board push-out part 78. The semiconductor board 1 is thereby stored with good quality in the storage container 18.

After the conveyance unit 13 moves the semiconductor board 1 onto the relay stage 79, the elevator device 75 raises the storage container 18. The board push-out part 78 then drives the arm 78a to move the semiconductor board 1 into the storage container 18. The storage unit 12 stores the semiconductor boards 1 in the storage container 18 in this manner. After a predetermined number of semiconductor boards 1 have been stored in the storage container 18, the operator replaces the storage container 18 in which the semiconductor boards 1 are stored with an empty storage container 18. The operator can thereby carry a plurality of semiconductor boards 1 as a batch to the next step.

The storage unit 12 has a relay point 12a for mounting a stored semiconductor board 1. The conveyance unit 13 stores semiconductor boards 1 in the storage container 18 in cooperation with the storage unit 12 merely by mounting the semiconductor boards 1 at the relay point 12a.

Conveyance Unit

Figure 7:
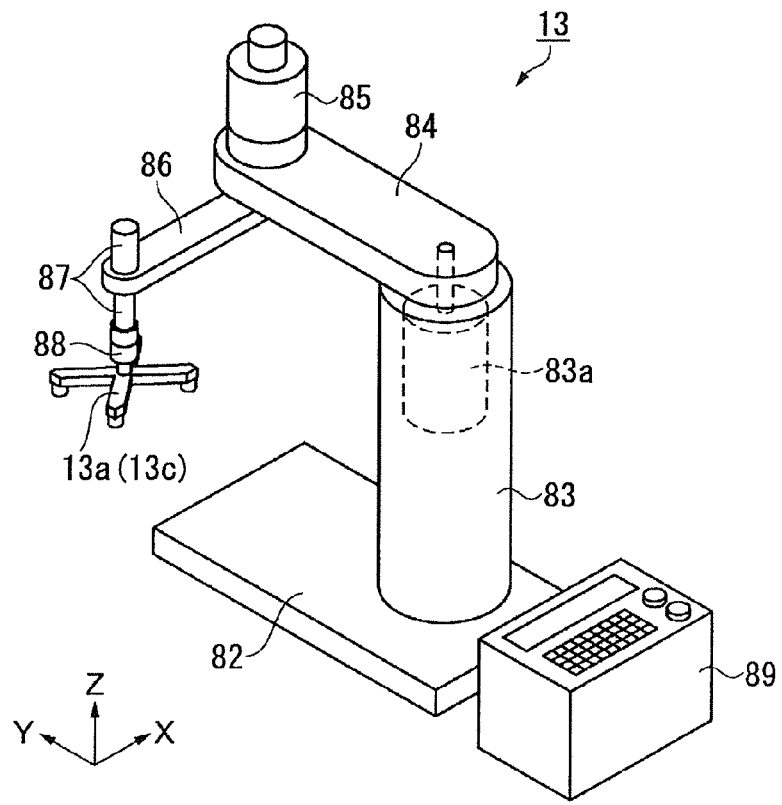
FIG. 7 is a simplified perspective view showing the configuration of the conveyance unit.

The conveyance unit 13 for conveying the semiconductor boards 1 will next be described with reference to FIG. 7. FIG.

7 is a simplified perspective view showing the configuration of the conveyance unit. As shown in FIG. 7, the conveyance unit 13 is provided with a flat plate-shaped base 82. A support platform 83 is provided on the base 82. A cavity is formed inside the support platform 83, and a rotation mechanism 83a composed of a motor, an angle detector, a speed reducer, and other components are provided in the cavity. An output shaft of the motor is connected to the speed reducer, and an output shaft of the speed reducer is connected to a first arm 84 disposed on a top side of the support platform 83. The angle detector is provided in connection with the output shaft of the motor, and the angle detector detects the rotation angle of the output shaft of the motor. The rotation mechanism 83a can thereby detect the rotation angle of the first arm 84 and rotate the first arm 84 to the desired angle.

A rotation mechanism 85 is provided on the first arm 84 at the opposite end thereof from the support platform 83. The rotation mechanism 85 is composed of a motor, an angle detector, a speed reducer, and other components, and has the same function as the rotation mechanism provided inside the support platform 83. An output shaft of the rotation mechanism 85 is connected to a second arm 86. The rotation mechanism 85 can thereby detect the rotation angle of the second arm 86 and rotate the second arm 86 to the desired angle.

An elevator device 87 is provided on the second arm 86 at the opposite end thereof from the rotation mechanism 85. The elevator device 87 is provided with a linear movement mechanism and can extend and retract by driving of the linear movement mechanism. A mechanism the same as the elevator device 16 provided to the feed unit 8, for example, may be used as the linear movement mechanism. A rotation device 88 is disposed on a bottom side of the elevator device 87.

The rotation device 88 may be any rotation device in which the rotation angle thereof can be controlled, and the rotation device 88 may be a combination of various motors and a rotation angle sensor. A stepping motor capable of rotating to a predetermined rotation angle may also be used. A stepping motor, for example, is used in the present embodiment. A speed reduction device may also be provided to enable rotation by finer angles.

The grasping part 13a is disposed below the rotation device 88 in the drawing. The grasping part 13a is connected to a rotating shaft of the rotation device 88. Consequently, driving the rotation device 88 causes the grasping part 13a to rotate in the conveyance unit 13. The grasping part 13a in the conveyance unit 13 can also be raised and lowered by driving of the elevator device 87.

The grasping part 13a has four linear fingers 13c, and a suction mechanism is formed whereby the semiconductor board 1 is suctioned and attached at the distal ends of the fingers 13c. Activating the suction mechanism enables the grasping part 13a to grasp the semiconductor board 1.

A control device 89 is provided on the −Y direction side of the base 82. The control device 89 is provided with a central computation device, a memory unit, an interface, an actuator drive circuit, an input device, a display device, and other components. The actuator drive circuit is a circuit for driving the rotation mechanism 83a, the rotation mechanism 85, the elevator device 87, the rotation device 88, and the suction mechanism of the grasping part 13a. These devices and circuits are connected to the central computation device via the interface. An angle detector is also connected to the central computation device via the interface. Program software indicating an operational procedure for controlling the conveyance unit 13, and data used in control are stored in the memory unit. The central computation device is a device for controlling the conveyance unit 13 in accordance with the program software. The control device 89 receives the output of the detector disposed in the conveyance unit 13 and detects the position and orientation of the grasping part 13a. The control device 89 then drives the rotation mechanism 83a and the rotation mechanism 85 and performs control for moving the grasping part 13a to a predetermined position.

Printing Method

Figure 8:
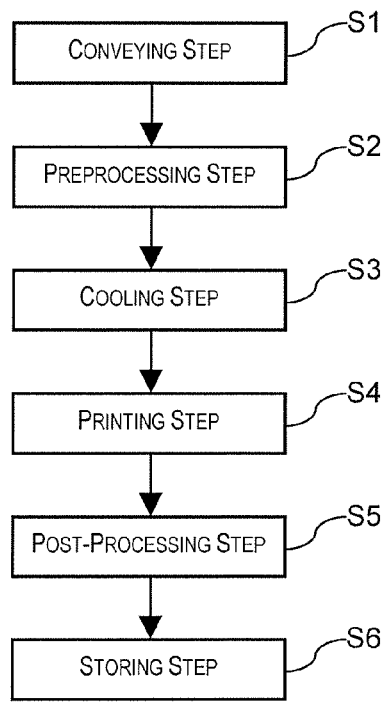
FIG. 8 is a flowchart showing the printing method.

The printing method using the printing device 7 described above will next be described with reference to FIG. 8. FIG. 8 is a flowchart showing the printing method.

As shown in the flowchart of FIG. 8, the printing method primarily comprises a conveying step S1 of conveying a semiconductor board 1 in from the storage container 18; a preprocessing step (first step) S2 of performing preprocessing of the surface of the conveyed semiconductor board 1; a cooling step (second step) S3 of cooling the semiconductor board 1 heated in the preprocessing step S2; a printing step (third step) S4 of drawing and printing various marks on the cooled semiconductor board 1; and a storing step S6 of storing the semiconductor board 1 on which various marks are printed in the storage container 18.

Among the steps described above, the steps from the preprocessing step S2 to the printing step S4 are characteristic features of the present invention, and the following description will therefore be of these characteristic features.

In the preprocessing step S2, either the first stage 27 or the second stage 28 is positioned at the relay point 9c in the preprocessing unit 9. The conveyance unit 13 moves the grasping part 13a to a position facing the stage that is positioned at the relay point 9c. The conveyance unit 13 then lowers the grasping part 13a, and then mounts the semiconductor board 1 on the first stage 27 or second stage 28 positioned at the relay point 9c by releasing suction on the semiconductor board 1. As a result, the semiconductor board 1 is mounted on the first stage 27 positioned at the relay point 9c (see FIG. 3B). Alternatively, the semiconductor board 1 is mounted on the second stage 28 positioned at the relay point 9c (see FIG. 3A).

The first stage 27 and the second stage 28 are heated in advance by the heating devices 27H, 28H, and the semiconductor board 1 mounted on the first stage 27 or the second stage 28 is immediately heated to a predetermined temperature. As described hereinafter, the temperature to which the semiconductor board 1 is heated is preferably equal to or below the heat resistance temperature of the semiconductor board 1, and such that the surface of the semiconductor board 1 can be effectively modified or organic substance on the surface can be efficiently removed, and in the present invention, the semiconductor board 1 is heated to a temperature of 150° C. to 200° C., e.g., 180° C.

When the conveyance unit 13 moves the semiconductor board 1 onto the first stage 27, preprocessing of the semiconductor board 1 on the second stage 28 is performed at the processing point 9d inside the preprocessing unit 9. After preprocessing of the semiconductor board 1 on the second stage 28 is completed, the second stage 28 moves the semiconductor board 1 to the second relay point 9b. The preprocessing unit 9 then moves the semiconductor board 1 mounted at the first relay point 9a to the processing point 9d opposite the carriage 31 by driving the first stage 27. Preprocessing of the semiconductor board 1 on the first stage 27 can thereby be started as soon as preprocessing of the semiconductor board 1 on the second stage 28 is completed.

In the preprocessing unit 9, ultraviolet rays are then radiated to the semiconductor device 3 packaged on the semiconductor board 1. Chemical bonds in irradiated organic substances in a surface layer of the semiconductor device 3 are thereby broken, reactive oxygen separated from ozone that is formed by the ultraviolet rays bonds to the molecules of the surface layer in which bonds were broken, conversion to highly hydrophilic groups (e.g., —OH, —CHO, —COOH) occurs, and the surface of the board 1 is modified and organic substances on the surface are removed. Since the semiconductor device 3 (semiconductor board 1) is irradiated by ultraviolet rays in a state of having been heated in advance to 180° C. as described above, the collision speed of molecules of the surface layer can be increased and the surface effectively modified without damage to the semiconductor board 1, and organic substances on the surface can be efficiently removed. After preprocessing, the preprocessing unit 9 moves the semiconductor board 1 to the first relay point 9*a* by driving the first stage 27.

In the same manner, when the conveyance unit 13 moves the semiconductor board 1 onto the second stage 28, preprocessing of the semiconductor board 1 on the first stage 27 is performed at the processing point 9*d* inside the preprocessing unit 9. After preprocessing of the semiconductor board 1 on the first stage 27 is completed, the first stage 27 moves the semiconductor board 1 to the first relay point 9*a*. The preprocessing unit 9 then moves the semiconductor board 1 mounted at the second relay point 9*b* to the processing point 9*d* opposite the carriage 31 by driving the second stage 28. Preprocessing of the semiconductor board 1 on the second stage 28 can thereby be started as soon as preprocessing of the semiconductor board 1 on the first stage 27 is completed. In the preprocessing unit 9, ultraviolet rays are then radiated to the semiconductor device 3 packaged on the semiconductor board 1, and the surface can thereby be effectively modified and organic substances on the surface efficiently removed without damage to the semiconductor board 1, the same as for the semiconductor board 1 on the first stage 27. After preprocessing, the preprocessing unit 9 moves the semiconductor board 1 to the second relay point 9*b* by driving the second stage 28.

When preprocessing of the semiconductor board 1 is completed in the preprocessing step S2 and the process transitions to the cooling step S3, the conveyance unit 13 mounts the semiconductor board 1 at the relay point 9*c* on the cooling plate 110*a* or 110*b* provided at the processing points 11*a*, 11*b*. The semiconductor board 1 heated in the preprocessing step S2, is thereby cooled (the temperature thereof is adjusted) for a predetermined time to the appropriate temperature (e.g., room temperature) for the printing step S4.

The semiconductor board 1 cooled in the cooling step S3 is conveyed by the conveyance unit 13 onto the stage 39 at the relay point 10*a*. In the printing step S4, the chuck mechanism in the application unit 10 is operated so that the semiconductor board 1 mounted on the stage 39 is retained on the stage 39. The application unit 10 then discharges droplets from the nozzles 52 formed in each droplet discharge head 49 while the carriage 45 scans and moves (relative movement) in the +X direction, for example, in relation to the stage 39.

The company name mark 4, model code 5, manufacturing number 6, and other marks are thereby drawn on the surface of the semiconductor device 3. The marks are then irradiated by ultraviolet rays from the curing unit 48 provided on the −X side of the carriage 45, which is the backward side in the scanning movement direction. Since a photopolymerization initiator for initiating polymerization by ultraviolet rays is included in the functional liquid 54 for forming the marks, the surfaces of the marks are immediately solidified or cured.

Here, the controller 14 turns on the curing unit 48 at the time at which the curing unit 48 is positioned above the semiconductor board 1, based on an encoder signal sent from the primary scanning position detection device 46. The controller 14 also turns off the curing unit 48 when the predetermined time set as described above elapses.

At this time, since the two droplet discharge heads 49 are disposed in the Y direction, which is the secondary scanning direction, and the nozzle rows 60 are also disposed in a line in the Y direction, the pinning time from the time the droplets 57 are discharged to the semiconductor device 3 and the time at which the droplets are irradiated by ultraviolet rays and cured is the same between the two droplet discharge heads 49.

When scanning movement of the carriage 45 in the +X direction is completed, the stage 39 is fed a distance LN (=LH) in the +Y direction, for example. While the carriage 45 scans and moves (relative movement) in the −X direction, for example, in relation to the stage 39, ultraviolet rays are radiated to the marks from the curing unit 48 provided on the +X side of the carriage 45, which is the backward side in the scanning movement direction, while droplets 57 are discharged from the nozzles 52 formed in each droplet discharge head 49.

Droplets are thereby also discharged to the area between the two droplet discharge heads 49, where droplets were not discharged by the first scanning movement. In droplet discharge by the second scanning movement as well, the pinning time from the time the droplets 57 are discharged to the semiconductor device 3 and the time at which the droplets are irradiated by ultraviolet rays and cured is the same between the two droplet discharge heads 49. Since the distance in the X direction between the nozzle rows 60 (true nozzle rows 60A) and the curing units 48 is the same on both sides, the pinning time is the same between the droplet discharge of the first scanning movement and the droplet discharge of the second scanning movement.

After printing on the semiconductor board 1 is performed, the application unit 10 moves the stage 39 on which the semiconductor board 1 is mounted to the relay point 10*a*. The conveyance unit 13 can thereby easily grasp the semiconductor board 1. The application unit 10 then releases the semiconductor board 1 by stopping the operation of the chuck mechanism.

The semiconductor board 1 is then conveyed to the storage unit 12 by the conveyance unit 13 and stored in the storage container 18 in the storing step S6.

In the present embodiment, the elapsed time since lighting of the curing units 48 is counted, and the curing units 48 are turned off when a predetermined time has elapsed, as described above. Through this configuration, even when the carriage 45 stops moving due to malfunction, for example, the curing units 48 are always turned off by timer control when the predetermined time has elapsed. It is therefore possible to prevent problems such as heat damage to the semiconductor board 1 and damage to the curing units 48 as a result of remaining lit for a long period of time.

In the present embodiment, since the two droplet discharge heads 49 are disposed so that the distance LH in the Y direction between the true nozzle rows 60A of adjacent droplet discharge heads 49 is a positive integer multiple of the distance LN in the Y direction between the true nozzle rows 60A, even when droplets are discharged to the semiconductor board 1 by a plurality of scanning movements, droplet discharge can be completed with the minimum number of scanning movements, and productivity can be enhanced.

Preferred embodiments of the present invention are described above with reference to the accompanying drawings, but the present invention shall not be construed as being limited by these examples. The shapes, combinations, and other aspects of the constituent members described in the examples above are merely examples, and various modifications may be made based on design requirements within a range that does not depart from the spirit of the invention.

For example, in the embodiment described above, ultraviolet-curing ink is used as the UV ink, but the present invention is not limited to this configuration, and various active ray-curing inks in which visible light or infrared rays are used as the curing light may be used.

The light source is also not particularly limited, and various active light sources which emit visible light and other active light may be used. In other words, various active ray irradiation units may be used.

The meaning of the term "active rays" in the present invention is not particularly limited insofar as "active rays" refers to rays capable of imparting energy whereby initiating species are formed in the ink by irradiation by the rays, and the term broadly encompasses α rays, γ rays, X rays, ultraviolet rays, visible light rays, electron rays, and the like. Among these rays, ultraviolet rays and electron rays are preferred, particularly ultraviolet rays, from the standpoint of curing sensitivity and ease of procuring a device for emitting the rays. Accordingly, ultraviolet-curing ink which can be cured by irradiation with ultraviolet rays, as in the present embodiment, is preferred for use as the active ray-curing ink.

In the embodiment described above, a configuration is described in which the nozzle rows extend in the secondary scanning direction (Y direction), but this configuration is not limiting, and the nozzle rows may also extend in a direction that intersects the secondary scanning direction (a direction at a predetermined angle to the Y direction).

In this case, since the distance between the curing units 48 and the nozzles constituting the nozzle rows is no longer constant, a configuration may be adopted in which the scanning movement speed to be adjusted is calculated using the average distance between the curing units 48 and the nozzles, for example.

In the preferred configuration, a single nozzle plate has a plurality of nozzle rows.

Adjacent nozzle rows can thereby be arranged at high density, and the size of the carriage can therefore be reduced. The ratio of the distance between nozzle rows and the distance between light sources/plurality of nozzle rows can also be reduced. The average time between landing and curing for all the nozzle rows can thereby be reduced. The time from landing to curing is thus more easily controlled so as to be constant.

A configuration may also be adopted in which the controller 14 computes the time needed for the curing units 48 to pass over the stage 39 from the width of the mounting surface 41 of the stage 39 in the movement direction (X direction) of the carriage 45, this width being stored in advance in the controller 14, instead of the width of the semiconductor board 1, and from the movement speed of the carriage 45 based on the signal of the primary scanning position detection device 46, and the computed time is set as the abovementioned predetermined time.

Figure 9:
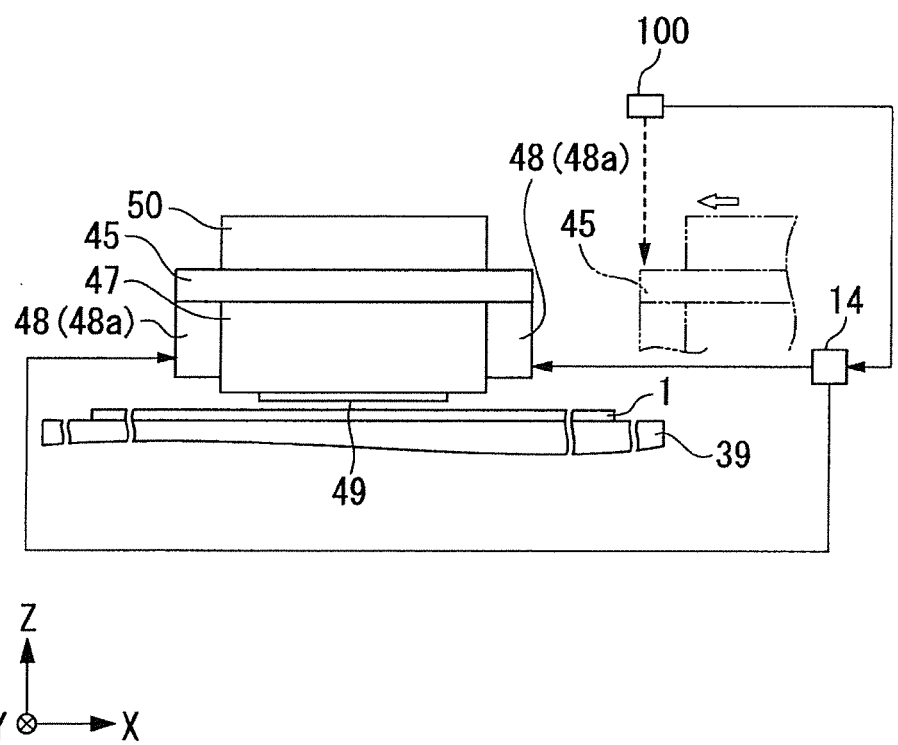
FIG. 9 is a view showing a configuration according to a modification of the method for acquiring the position information of the carriage.

In the embodiment described above, a case is described in which the controller 14 controls the timing for lighting the curing units 48 based on a signal from the primary scanning position detection device 46, but a configuration may be adopted in which a sensor (detector) 100 is provided for detecting the position of the carriage 45 as shown in FIG. 9, and the controller 14 turns on the curing units 48 based on a signal from the sensor 100. The sensor 100 is positioned so as to be able to detect that the carriage 45 has reached a predetermined position (the position at which the droplet discharge heads 49 and the semiconductor board 1 are facing each other). The sensor 100 may be provided to the guide member 43.

Through this configuration, the controller 14 can accurately perceive the position of the carriage 45 by receiving the signal from the sensor 100 and turn on the curing units 48 at the optimum timing.

The controller 14 may also set as the abovementioned predetermined time the time needed for recording on the entire surface of the semiconductor board 1 to be completed, this time being based on the movement speed of the carriage 45 and the width of the semiconductor board 1. The number of times the curing units 48 are turned on or turned off can thereby be reduced, and the curing units 48 can be more easily controlled.

In the case that the predetermined time is set from the movement speed of the carriage 45 and the width of the semiconductor board 1, there is a risk of the curing units 48 turning off before the curing units 48 have finished passing over the semiconductor board 1 when there is an error in the movement speed of the carriage 45, for example. However, when the predetermined time is set from the movement speed of the carriage 45 and the width of the stage 39, the curing units 48 can be turned off after the curing units 48 have at least finished passing over the semiconductor board 1, even when there is some error in the movement speed of the carriage 45, for example. Specifically, a margin can be maintained in the lighting time of the curing units 48, and ultraviolet rays can be reliably radiated onto the entire area of the semiconductor board 1.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A printing device comprising:
a discharge head configured and arranged to discharge droplets of a liquid curable by active rays onto a substrate while the discharge head and the substrate move relative to each other;
an irradiation unit configured and arranged to radiate the active rays to the droplets on the substrate, the irradiation unit being provided behind the discharge head with respect to a direction of a relative movement; and
a controller configured to turn off the irradiation unit in response to the controller determining that a predetermined time has elapsed since start of lighting of the irradiation unit, with the predetermined time corresponding to a time period needed for the irradiation unit to relatively pass over an entire length of the substrate in the direction of the relative movement.

2. The printing device according to claim 1, wherein the controller is configured to set the predetermined time based on a speed of the relative movement and a width of the substrate in the direction of the relative movement.

3. The printing device according to claim 1, wherein the controller is configured to set the predetermined time based on a speed of the relative movement and a width, in the direction of the relative movement, of a mounting stage for mounting the substrate.

4. The printing device according to claim 1, further comprising
a carriage integrally retaining the discharge head and the irradiation unit such that the discharge head and the irradiation unit move with respect to the substrate, and
a position information acquisition device configured and arranged to acquire position information of the carriage,
the controller being configured to control lighting timing of the irradiation unit based on the position information of the carriage from the position information acquisition device.

5. The printing device according to claim 1, further comprising
a carriage integrally retaining the discharge head and the irradiation unit such that the discharge head and the irradiation unit move with respect to the substrate, and
a detector configured and arranged to detect that the carriage has reached a predetermined position,
the controller being configured to turn on the irradiation unit in response to a detection signal from the detector.

* * * * *